United States Patent
Hsu et al.

(10) Patent No.: US 8,835,265 B1
(45) Date of Patent: Sep. 16, 2014

(54) HIGH-K DIELECTRIC DEVICE AND PROCESS

(75) Inventors: Che Ta Hsu, San Jose, CA (US); Fangyun Richter, San Jose, CA (US); Ning Cheng, San Jose, CA (US); Jeffrey Xiaoqi Tung, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/525,864

(22) Filed: Jun. 18, 2012

(51) Int. Cl.
*H01L 21/336* (2006.01)
*H01L 29/78* (2006.01)
*H01L 21/8232* (2006.01)
*H01L 29/66* (2006.01)
*H01L 21/8238* (2006.01)

(52) U.S. Cl.
CPC ........ *H01L 21/8232* (2013.01); *H01L 29/7833* (2013.01); *H01L 29/66477* (2013.01); *H01L 21/8238* (2013.01)
USPC ........................................ 438/299

(58) Field of Classification Search
CPC ............ H01L 21/8232; H01L 21/8234; H01L 21/8238; H01L 29/66477; H01L 29/772; H01L 29/78; H01L 29/7833
USPC ........... 438/199, 229, 230, 299; 257/E21.382
See application file for complete search history.

(56) References Cited

U.S. PATENT DOCUMENTS

| | | | | |
|---|---|---|---|---|
| 5,434,093 A | * | 7/1995 | Chau et al. | 438/300 |
| 5,905,285 A | * | 5/1999 | Gardner et al. | 257/344 |
| 5,953,602 A | * | 9/1999 | Oh et al. | 438/201 |
| 6,033,963 A | * | 3/2000 | Huang et al. | 438/303 |
| 6,108,242 A | * | 8/2000 | Lin et al. | 365/185.33 |
| 6,124,177 A | * | 9/2000 | Lin et al. | 438/305 |
| 6,169,315 B1 | * | 1/2001 | Son | 257/408 |
| 6,297,132 B1 | * | 10/2001 | Zhang et al. | 438/514 |
| 6,326,272 B1 | * | 12/2001 | Chan et al. | 438/300 |
| 6,639,288 B1 | * | 10/2003 | Kunikiyo | 257/412 |
| 6,812,111 B2 | * | 11/2004 | Cheong et al. | 438/396 |
| 6,864,135 B2 | * | 3/2005 | Grudowski et al. | 438/230 |
| 6,867,082 B2 | * | 3/2005 | Kim et al. | 438/201 |
| 7,041,538 B2 | * | 5/2006 | Ieong et al. | 438/151 |
| 7,160,780 B2 | * | 1/2007 | Lee et al. | 438/283 |
| 2002/0102790 A1 | * | 8/2002 | Kim | 438/239 |
| 2002/0155664 A1 | * | 10/2002 | Noro | 438/263 |

(Continued)

OTHER PUBLICATIONS

M.T.Bohr et al.,"The High-k Solution," IEEE Spectrum (Oct. 2007) (eight pages).

(Continued)

*Primary Examiner* — Michele Fan
(74) *Attorney, Agent, or Firm* — Ward & Zinna, LLC

(57) ABSTRACT

An insulating layer is formed on a semiconductor substrate; and holes are patterned in the insulating layer where transistor gates are to be formed. A hard mask spacer layer is formed on the upper surface of the insulating layer and the holes. Next, the spacer layer is anisotropically etched to remove the portion of the spacer layer exposed at the bottom of each hole as well as the portion of the spacer layer on the upper surface of the insulating layer. However, the etching process does not remove all of the portion of the spacer layer formed on the substantially vertical sidewalls of the holes. A high-k dielectric layer is then formed on the remaining vertical portion of the spacer layer and on the exposed upper surfaces of the substrate and the insulating layer. A metal layer is then formed on the high-k dielectric layer; and individual gate structures are completed.

12 Claims, 3 Drawing Sheets

(56) References Cited

U.S. PATENT DOCUMENTS

| | | | |
|---|---|---|---|
| 2004/0033657 A1* | 2/2004 | Chuang et al. | 438/230 |
| 2004/0113212 A1* | 6/2004 | Lee et al. | 257/408 |
| 2004/0203198 A1* | 10/2004 | Cho et al. | 438/200 |
| 2006/0043462 A1* | 3/2006 | Manning et al. | 257/316 |
| 2007/0224767 A1* | 9/2007 | Lin et al. | 438/301 |
| 2010/0001317 A1* | 1/2010 | Chen et al. | 257/192 |
| 2011/0237062 A1* | 9/2011 | Na et al. | 438/592 |
| 2012/0104470 A1* | 5/2012 | Ponoth et al. | 257/288 |
| 2012/0139062 A1* | 6/2012 | Yuan et al. | 257/411 |
| 2012/0313165 A1* | 12/2012 | Liu | 257/336 |

OTHER PUBLICATIONS

E.P.Gusev et al., "Advanced High-k Dielectric Stacks with Poly Si and Metal Gates: Recent Progress and Current Challenges," IBM J. Res. & Dev., vol. 50, No. 4/5 (July Sept. 20.

J.D.Plummer et al., Silicon VLSI Technology Fundamentals, Practice and Modeling, pp. 71-82 (Prentice Hall 2000).

S.A.Campbell, The Science and Engineering of Microelectronic Fabrication, pp. 455-458 (2nd Ed., Oxford University Press 2001).

* cited by examiner

HIGH-K DIELECTRIC DEVICE AND PROCESS

BACKGROUND

This relates to a MOS gate structure and a method for forming the gate. It is especially useful in high-k dielectric last technology and will be described in that context. However, it may also be used in other technologies.

In recent years, the continued progress in reducing the physical size of semiconductors has required a major change in the composition of the gate structure in a PMOS or NMOS transistor. In particular, the thickness of the silicon dioxide insulator became so small that quantum effects resulted in substantial leakage currents through the insulator. As a result, it became necessary to replace the silicon dioxide insulator and, with it, the polysilicon gate. The replacement structure was a metal gate with a high-k dielectric that greatly reduced the leakage current For further details, see M. T. Bohr, et al., "The High-k Solution", *IEEE Spectrum* (October 2007); E. P. Gusev et al, "Advanced High-k Dielectric Stacks with PolySi and Metal Gates: Recent Progress and Current Challenges," *IBM J. Res. & Dev.*, Vol. 50, No. 4/5 (July/September 2006), both of which are incorporated herein in their entireties.

The use of a metal gate and high-k dielectric introduced other issues into the semiconductor device manufacturing process. Of particular importance, high temperature annealing operations performed after implanting operations such as those for forming LDD regions, sources and drains were not compatible with the metal gate and high-k dielectric structures. As a result, fabrication processes were developed and implemented in which the high-k dielectric and metal layer were the last elements to be formed in the process. Such fabrication processes are sometimes referred to as high-k dielectric last processes.

While the high-k dielectric last process has facilitated the implementation of the Semiconductor Roadmap at technology nodes of 65 nm and beyond, the constantly decreasing size of the MOS gate continues to produce challenges. For example, other types of current leakage such as that caused by drain induced barrier lowering (DIBL) remain a problem. And capacitance between the gate and the source/drain (gate-source/drain overlap capacitance (Cov)) interferes with efforts to increase the switching speed of the transistors in devices such as Field Programmable Gate Arrays (FPGA). There are also problems in the fabrication of the structures of the semiconductor devices. For example, as the length of the transistor gates gets smaller and smaller, the size of the holes made in the insulating layer to form the gates should also get smaller except that it becomes increasingly more difficult to fill those holes with gate metallization.

SUMMARY

The present invention is an improved high-k dielectric device and process.

In an illustrative embodiment, an insulating layer is formed on the substrate; and holes are patterned in the insulating layer where the gates of NMOS and PMOS transistors are to be formed. A hard mask spacer layer is formed on the upper surface of the insulating layer, on the substantially vertical sidewalls of the holes, and on the exposed portions of the upper surface of the substrate at the bottom of the holes. Next, the spacer layer is anisotropically etched to remove the portion of the spacer layer exposed at the bottom of each hole as well as the portion of the spacer layer on the upper surface of the insulating layer. However, the etching process does not remove all of the portion of the spacer layer formed on the substantially vertical sidewalls of the holes. Rather, the duration of the etching process is controlled so as to leave a vertical portion of the spacer layer having a desired thickness at the bottom of the hole and a taper that begins part way up the sidewall.

A high-k dielectric layer is then formed on the remaining vertical portion of the spacer layer and on the exposed upper surfaces of the substrate and the insulating layer. A metal layer is then formed on the high-k dielectric layer; and bulk gate metal is then formed on the metal layer. Chemical mechanical polishing is then performed to remove the bulk gate metal down to the insulating layer, thereby isolating individual NMOS and PMOS gate structures. Contacts are then formed to the individual gate structures as well as to other structures in the device. Finally, the wafer is singulated.

As will be described in more detail below, the use of a spacer layer and an anisotropic etching process make it possible to form a device having more uniform dimensions in the gate region. This enables reductions in the overlap capacitance (Cov) and the drain induced barrier lowering (DIBL) effect. It also makes it possible to improve the filling of the high-k dielectric and gate metals in the gate holes.

Numerous variations may be practiced in the invention.

BRIEF DESCRIPTION OF THE DRAWINGS

These and other objects and advantages of the present invention will be apparent to those of ordinary skill in the art in view of the following detailed description in which.

It will be appreciated that the drawings are not to scale.

DETAILED DESCRIPTION

Figure 1:
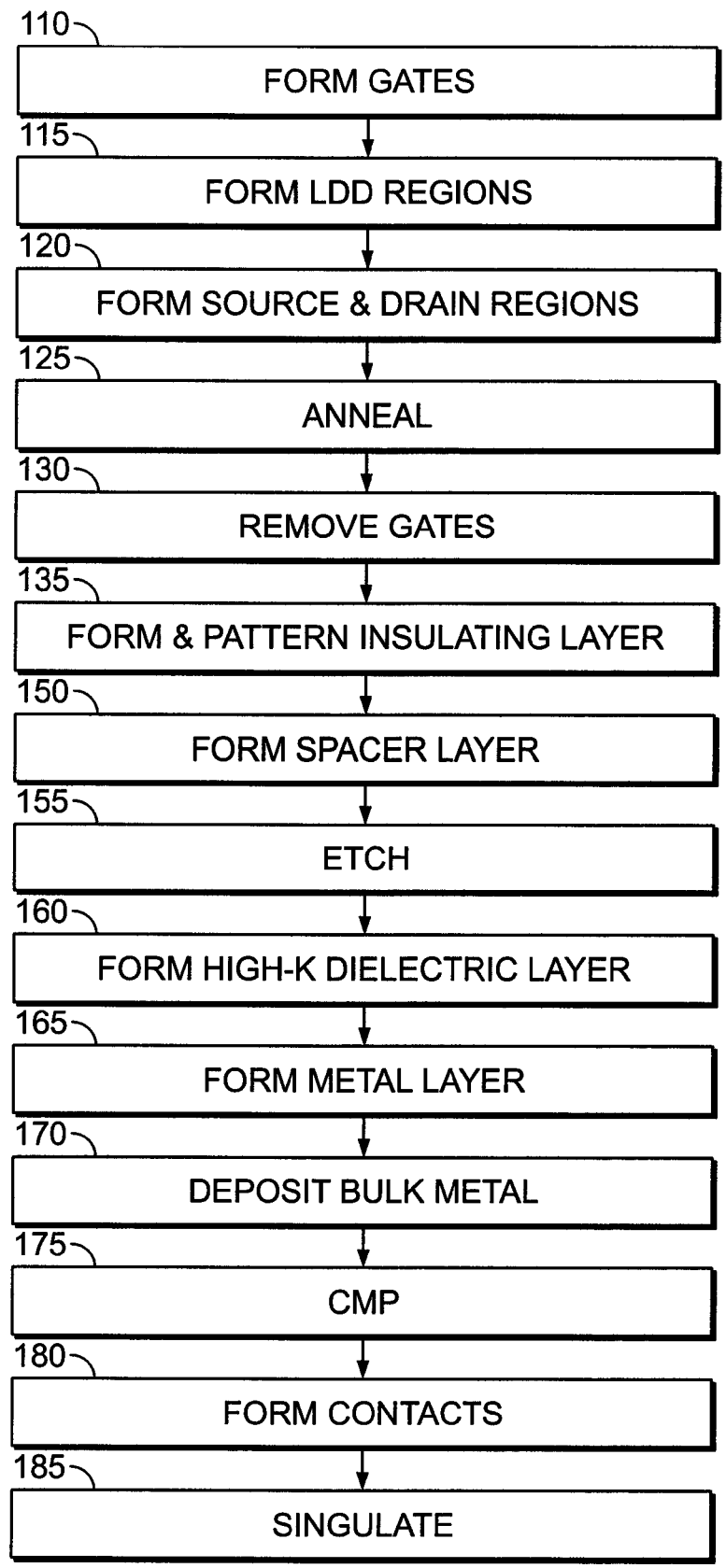
FIG. 1 is a flowchart of an illustrative embodiment of a process of the present invention.

FIG. 1 is a flowchart depicting some of the major steps in making NMOS and

PMOS transistors in an illustrative embodiment of the invention. It will be understood that these steps are performed on a semiconductor substrate that typically is a wafer of silicon up to 12 inches (300 cm.) in diameter in today's state-of-the-art processes. Individual PMOS and NMOS transistors are quite small which allows for the formation of several hundred integrated circuits on a single wafer, each integrated circuit having up to a billion or so MOS transistors. FIGS. 2A-2F depict illustrative cross-sections of one such NMOS transistor and one such PMOS transistor at certain steps in the process of FIG. 1.

At step 110 of FIG. 1, polysilicon gates are formed on a substrate wherever a gate will ultimately be used. At step 115, LDD regions are then formed on either side of each gate using the gate as a mask to define where the regions are formed. Next, source and drain regions are formed in the substrate at step 120 again using the gate and side spacers to define where the source and drain regions are formed. Typically, the LDD regions, the source regions and the drain regions are formed by ion implantation of dopants and the damage caused by the ion implantation is thermally annealed at step 125. As will be appreciated by those skilled in the art, both PMOS and NMOS structures are typically formed in the same integrated circuit. This is accomplished by first implanting first portions of the substrate with dopants of one conductivity type and subsequently implanting other portions of the substrate with dopants of the other conductivity type. Further details concerning steps 110 to 125 are set forth in S. A. Campbell, *The Science and Engineering of Microelectronic Fabrication* (2nd ed.)(Oxford 2001); J. D. Plummer et al., *Silicon VLSI Technology Fundamentals, Practice and Modeling* (Prentice Hall 2000), which are incorporated by reference in their entireties.

Figure 2A:
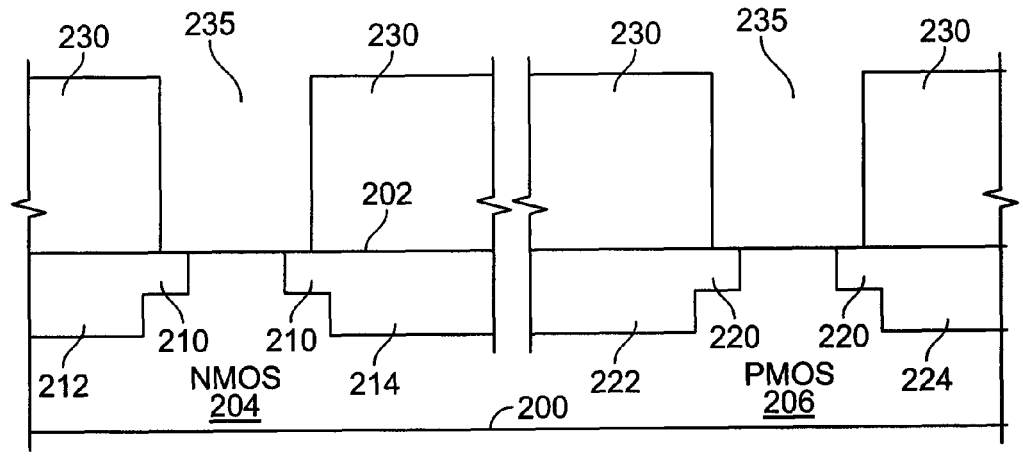
FIGS. 2A-2F are cross-sections of illustrative NMOS and PMOS transistors at various stages of the process of FIG. 1.

In the process depicted in FIG. 1, the polysilicon gates are then removed at step 130 An insulating layer is formed on the substrate and patterned at step 135 to define the regions where the metal gates are to be formed. FIG. 2A depicts an illustrative cross-section of the NMOS and PMOS transistors after step 135. More particularly, FIG. 2A depicts a substrate 200 having an upper surface 202, a first region 204 that is doped with dopants of P-type conductivity and a second region 206 that is doped with dopants of N-type conductivity. It will be appreciated that in a state-of-the-art substrate, there are many billions of such regions 204, 206. In the first region 204 are formed LDD regions 210, a source region 212 and a drain region 214 of N-type conductivity; and in the second region 206 are formed LDD regions 220, a source region 222 and a drain region 224 of P-type conductivity. An insulating layer 230 is formed on the substrate; and holes 235 are patterned in the insulating layer where the gates of the NMOS and PMOS transistors are to be formed. As shown in FIG. 2A, holes 235 extend from an upper surface 232 of insulating layer 230 down to the upper surface 202 of substrate 200. Holes 235 have substantially vertical sidewalls 237.

Figure 2B:
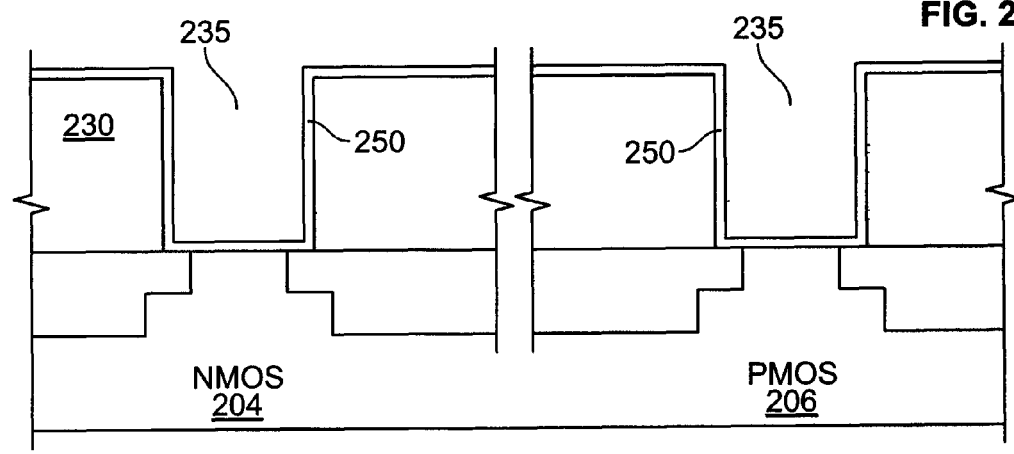

At step 150, a spacer layer 250 is formed on the upper surface of the insulating layer, on the substantially vertical sidewalls of the holes in the insulating layer and on the exposed portions of the upper surface of the substrate at the bottom of the holes. The spacer layer is depicted in FIG. 2B. Illustratively, spacer layer 250 is a hard mask layer made of materials such as silicon nitride, SiNx, carbon-doped silicon dioxide, amorphous/plasma enhanced chemical vapor deposition (PECVD) carbon. Illustratively, the thickness of the spacer layer is in the range of 1 to 10 nanometers (nm) with current technologies and can be expected to decrease in the future.

Figure 2C:
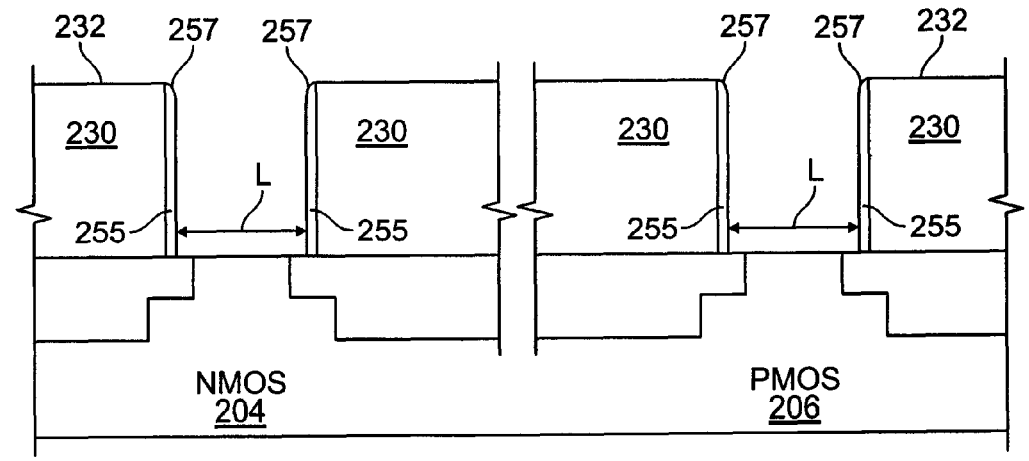

At step 155, the hard mask is etched using a plasma etchant. The etching process is anisotropic with a vertical etch rate that is faster than a lateral etch rate As a result, the etching process removes the material of the spacer layer that lies on a horizontal surface faster than it removes the material that lies on a vertical surface. Specifically, the etching process removes the portion of the spacer layer exposed at the bottom of each hole. Since the etching process operates uniformly on the horizontal surfaces of the device, the process also removes all of the portion of the spacer layer on upper surface 232 of insulating layer 230. However, the etching process does not remove all of the portion of the spacer layer formed on the substantially vertical sidewalls of the holes. Rather, it removes only a portion of the thickness of the vertical portion of the spacer layer, leaving sidewalls 255 separated by a distance L. The amount of the vertical portion of spacer layer 250 that is removed depends on the lateral etch rate of the etchant and the duration of the etching process. At the inside upper edge of the vertical portion of the spacer, the anisotropic etching process produces a taper 257 that begins part way up the sidewall and reduces in thickness moving farther up the sidewall. Thus, the width of the hole grows gradually wider with increasing distance from the bottom of the hole. FIG. 2C depicts an illustrative cross-section after completion of etching step 155.

Suitable anisotropic etchants are known for a wide variety of materials that may be used for the spacer layer. For example, for silicon nitride hard masks, suitable etchants are fluorine deficient fluorocarbon plasmas such as CF4/H2, CHF3, C2HF5 or C4F8.

Figure 2D:
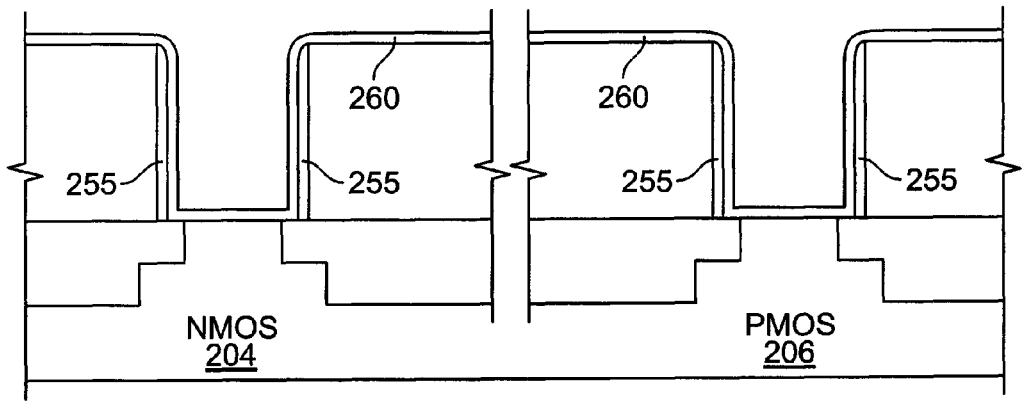

At step 160, a high-k dielectric layer 260 is formed on the remaining vertical portion 255 of spacer layer 250 and on the exposed upper surfaces 202, 232 of substrate 200 and insulating layer 230 as depicted in FIG. 2D. A variety of high-k dielectric materials are available for use. One such material is Hafnium oxide. Typically, the high-k dielectric layer is less than about 10 nm thick.

Figure 2E:
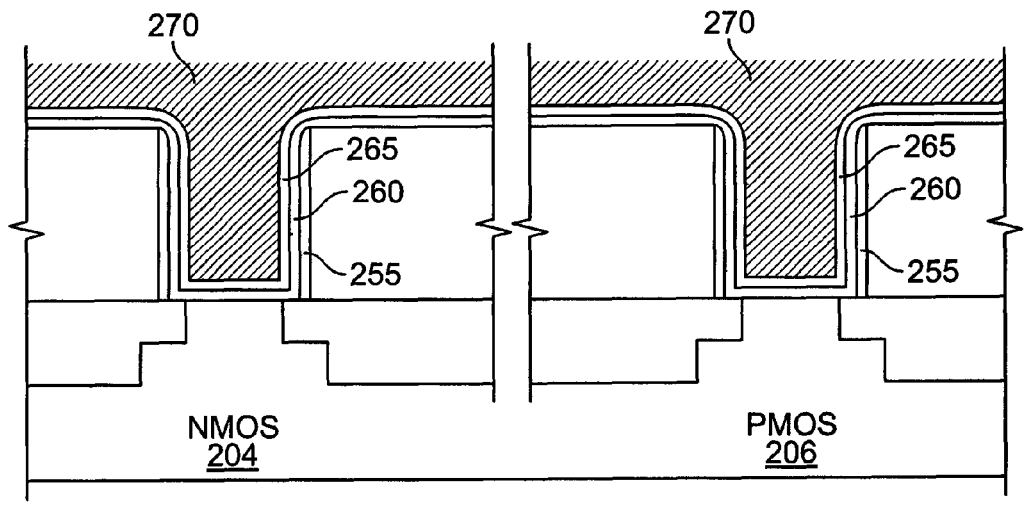

A metal layer 265 is then formed on the high-k dielectric layer 260 at step 165. This layer is typically aluminum and is less than approximately 100 nm thick. Bulk gate metal 270 is then formed on the metal layer at step 170. The resulting structure is shown in FIG. 2E.

Figure 2F:
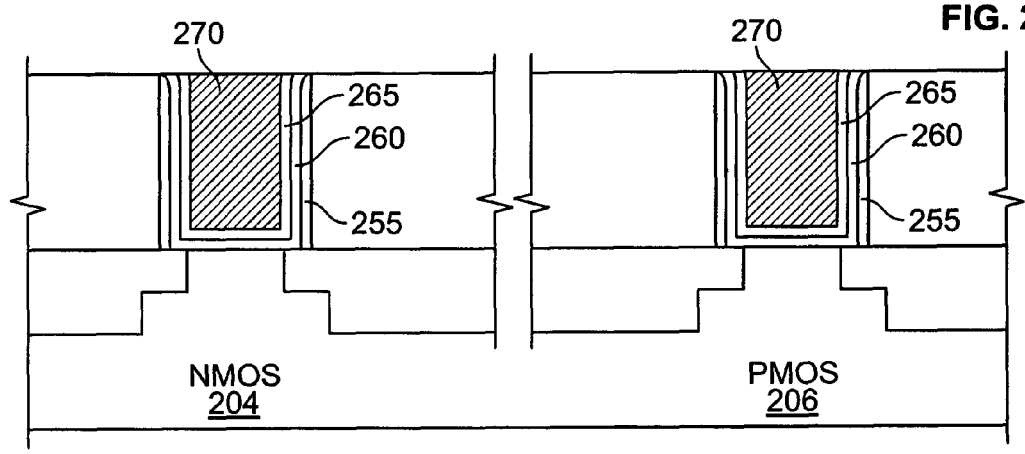

Chemical mechanical polishing is then performed at step 175 to remove the bulk gate metal down to the insulating layer. As shown in FIG. 2F, this isolates the individual NMOS and PMOS gate structures. At step 180, contacts are formed to the individual NMOS and PMOS transistors as well as to other structures in the device. Finally, at step 185, the wafer is singulated so as to separate the integrated circuits into separate dies.

Since the distance L between the sidewalls can be controlled by controlling the thickness of spacer layer 250 and the duration of etching step 155, the length of the high-k dielectric layer 260 and the length of metal layer 265 in the same direction can also be controlled very precisely by controlling the duration of the etching step 155. This makes it possible to control the amount by which the gate overlaps the source and drain regions of the NMOS and PMOS transistors and thereby reduce the device overlap capacitance (Coy). Reductions in overlap capacitance on the order of 50 percent (%) are possible which, in turn, make possible significant improvements in device speed.

Since the length of the gate can be precisely controlled, it is also possible to reduce the drain induced barrier lowering (DIBL) by up to approximately 70 mV which lowers leakage currents by a factor of up to 3. This also makes it possible to use deeper LDD regions which results in lower substrate resistance Rs.

The taper 257 at the upper end of the sidewall spacers 255 provide a structure that facilitates the formation of the high-k dielectric layer 260 and the metal layer 265. The taper provides a relatively smooth transition from the vertical surface of the sidewalls of the holes to the horizontal upper surface of the insulating layer. The taper also ensures that the distance between the sidewalls of the hole at the top of each hole is greater than the distance L between the sidewalls at the bottom of the hole. This funnel shape reduces the likelihood of unwanted accumulation of fill material at the top of the hole and, in general, facilitates filling the holes with gate metallization.

Numerous variations may be practiced in the embodiment depicted in FIGS. 1 and 2A-2F. The hard mask materials used for the spacer layer are only illustrative. Numerous other materials are available for use as the spacer layer and others are being developed. Appropriate anisotropic etches will be apparent for the hard mask materials identified and others are likely to be devised.

While the embodiment of FIGS. 1 and 2A-2F has been described for the case where the same metal layer is used for the gates of both the NMOS and PMOS transistors, the invention may also be practiced where different metal layers are used for the gates of the NMOS and PMOS transistors. In this circumstance, a first metal layer is formed on the high-k dielectric layer as in step 165. This layer is then patterned to form the metal gates for one type of transistors, illustratively, the PMOS transistors. As a result, the upper surface on one portion of the device is the high-k dielectric layer and on a second portion of the device it is the metal layer that is used to form the gates for the PMOS devices. Next, a second metal layer is formed on the entire surface of the device; and a bulk gate metal is then formed on the second metal layer. The second metal layer serves as the gates for the NMOS devices.

Specific details for the formation of the spacer layer, the high-k dielectric layer, the metal layer, and the bulk metal fill have not been supplied because many such processes are well known in the industry. For example, details of many of these processes are set forth in the above-referenced textbooks of Campbell and Plummer. While the embodiments have been described in terms of single layers, it will be understood that the single layers may be formed of multiple sub-layers that provide a multiplicity of functions.

In the interest of simplicity and to avoid obscuring the invention, only the major steps of the semiconductor fabrication process have been described. It will also be understood that many additional steps and details have been omitted as unnecessary for an understanding of the invention.

What is claimed is:

1. A method for fabricating a MOS transistor in a semiconductor substrate having a first conductivity type comprising:
    forming source and drain regions by implanting in the semiconductor substrate ions having a second conductivity type;
    forming an insulating layer on an upper surface of the semiconductor substrate;
    removing a portion of the insulating layer to form a hole that exposes the upper surface of the semiconductor substrate between the source and drain regions;
    forming a spacer layer on an upper surface of the insulating layer, on sidewalls of the hole in the insulating layer and on the exposed upper surface of the semiconductor substrate;
    forming spacers by anistropically etching the spacer layer so as to remove the spacer layer on the upper surface of the semiconductor substrate, thereby exposing the upper surface of the semiconductor substrate, and to remove a portion of the spacer layer on the sidewalls of the insulating layer;
    forming a high-k dielectric layer between the spacers on the exposed upper surface of the semiconductor substrate; and
    forming a gate on the portion of the high-k dielectric layer formed between the spacers on the exposed upper surface of the semiconductor substrate; wherein a top surface of the gate is substantially co-planar with a top surface of the insulating layer.

2. The method of claim 1 further comprising forming electrical connections to the gate, the source region and the drain region.

3. The method of claim 1 further comprising forming LDD Regions.

4. The method of claim 1 wherein the spacer layer is a hard mask layer and the etching is performed using a plasma etch.

5. The method of claim 1 wherein the spacer layer is a layer of silicon nitride, a layer of carbon-doped silicon dioxide, or a layer of amorphous/plasma enhanced chemical vapor deposition(PECVD)carbon.

6. The method of claim 1 when the etching step is performed using a fluorine-deficient fluorocarbon plasma etchant.

7. A method for fabricating an integrated circuit structure in a semiconductor substrate comprising:
    forming first source and drain regions by implanting ions having a first conductivity type in a first portion of the semiconductor substrate having a second conductivity type;
    forming second source and drain regions by implanting ions having a second conductivity type in a second portion of the semiconductor substrate having a first conductivity type;
    forming an insulating layer on an upper surface of the semiconductor substrate;
    removing portions of the insulating layer to form holes that expose the upper surface of the semiconductor substrate between the first source and drain regions and between the second source and drain regions;
    forming a spacer layer on an upper surface of the insulating layer, on sidewalls of the holes in the insulating layer and on the exposed upper surface of the semiconductor substrate;
    anisotropically etching the spacer layer so as to remove both the spacer layer on the upper surface of the semiconductor substrate in the holes, thereby exposing the upper surface of the semiconductor substrate, and portions of the spacer layer on the sidewalls of the holes in the insulating layer;
    forming a high-k dielectric layer on the exposed upper surface of the semiconductor substrate in the holes; and
    forming gates on the portions of the high-k dielectric layer formed on the exposed upper surface of the semiconductor substrate in the holes.

8. The method of claim 7 further comprising forming electrical connections to the gate, the source region and the drain region.

9. The method of claim 7 further comprising forming LDD Regions.

10. The method of claim 7 wherein the spacer layer is a hard mask layer and the etching step is performed using a plasma etch.

11. The method of claim 7 wherein the spacer layer is a layer of silicon nitride, a layer of carbon-doped silicon dioxide, or a layer of amorphous/plasma enhanced chemical vapor deposition(PECVD)carbon.

12. The method of claim 7 when the etching step is performed using a fluorine-deficient fluorocarbon etchant.

* * * * *